United States Patent
Nguyen et al.

(10) Patent No.: US 12,264,110 B2
(45) Date of Patent: Apr. 1, 2025

(54) SYSTEM AND METHOD FOR COATING CERAMIC FIBER

(71) Applicant: General Electric Company, Schenectady, NY (US)

(72) Inventors: John Tam Nguyen, Cincinnati, OH (US); Clifford Takashi Tanaka, Cincinnati, OH (US); Theodore Robert Grossman, Cincinnati, OH (US); Reza T. Tavana, West Chester, OH (US)

(73) Assignee: General Electric Company, Evendale, OH (US)

( * ) Notice: Subject to any disclaimer, the term of this patent is extended or adjusted under 35 U.S.C. 154(b) by 794 days.

(21) Appl. No.: 17/381,847

(22) Filed: Jul. 21, 2021

(65) Prior Publication Data

US 2023/0028215 A1    Jan. 26, 2023

(51) Int. Cl.
    C04B 35/80     (2006.01)
    C04B 35/628    (2006.01)
    D06M 23/06     (2006.01)

(52) U.S. Cl.
    CPC ........ *C04B 35/80* (2013.01); *C04B 35/62868* (2013.01); *D06M 23/06* (2013.01); *C04B 2235/5244* (2013.01)

(58) Field of Classification Search
    CPC .............. C04B 35/80; C04B 35/62868; C04B 2235/5244; D06M 23/06
    See application file for complete search history.

(56) References Cited

U.S. PATENT DOCUMENTS

| | | | |
|---|---|---|---|
| 7,200,912 B2 | 4/2007 | Bouillon et al. |
| 7,740,474 B2 | 6/2010 | Scheibel et al. |
| 8,529,995 B2 | 9/2013 | Eberling-Fux et al. |
| 9,815,736 B2 | 11/2017 | Dunn et al. |
| 9,966,240 B2 | 5/2018 | Park et al. |

(Continued)

FOREIGN PATENT DOCUMENTS

| | | |
|---|---|---|
| CN | 202323014 U | 7/2012 |
| CN | 207091703 U | 3/2018 |

(Continued)

OTHER PUBLICATIONS

Naslain et al., "Micro/minicomposites: a useful approach to the design and development of non-oxide CMC's", Composites: Part A, Amsterdam, 1999, pp. 537-547.

*Primary Examiner* — Michael G Miller
(74) *Attorney, Agent, or Firm* — Dority & Manning, P.A.

(57) ABSTRACT

A system for coating ceramic fibers for use in manufacturing a ceramic matric composite (CMC) article includes a frame having a plurality of frame members arranged so as to create a void therebetween. At least one of frame members includes a hollow body and at least one perforated hole defined in the hollow body. Thus, the ceramic fibers are securable at respective ends of the frame and extend across the void. The frame also includes an inlet in fluid communication with the perforated hole(s) so as to allow a coating material to flow into and through the hollow body and out of the perforated hole(s) at a location of at least a portion of one of the ceramic fibers. As such, the coating material is configured to cause the portion of one of the ceramic fibers to separate from the frame such that the portion is uniformly coated with the coating material.

9 Claims, 7 Drawing Sheets

(56) References Cited

U.S. PATENT DOCUMENTS

| | | | |
|---|---|---|---|
| 9,975,815 B2 | 5/2018 | Steibel | |
| 10,047,015 B2 | 8/2018 | Pegna et al. | |
| 10,052,789 B2 | 8/2018 | Dunn et al. | |
| 10,370,292 B2 | 8/2019 | Dunn et al. | |
| 2005/0109279 A1 | 5/2005 | Suzuki | |
| 2007/0099527 A1 | 5/2007 | Brun et al. | |
| 2011/0171399 A1 | 7/2011 | Brun et al. | |
| 2016/0229758 A1 | 8/2016 | Kmetz et al. | |
| 2017/0015595 A1 | 1/2017 | Weaver et al. | |
| 2019/0093231 A1 | 3/2019 | She et al. | |
| 2019/0177240 A1 | 6/2019 | Harris | |
| 2019/0210932 A1 | 7/2019 | Veljkovic et al. | |
| 2020/0123067 A1* | 4/2020 | Freeman | C04B 35/62863 |
| 2020/0148600 A1 | 5/2020 | She et al. | |

FOREIGN PATENT DOCUMENTS

| | | |
|---|---|---|
| CN | 207581935 U | 7/2018 |
| CN | 112981371 A | 6/2021 |

* cited by examiner

SYSTEM AND METHOD FOR COATING CERAMIC FIBER

FIELD

The present disclosure relates generally to systems and methods for processing ceramic fibers, and more particularly to systems and methods for coating and/or processing ceramic fibers for use in manufacturing ceramic matrix composite (CMC) articles.

BACKGROUND

Ceramic matrix composites (CMCs) generally include a ceramic fiber reinforcement material embedded in a ceramic matrix material. The reinforcement material may be discontinuous short fibers that are randomly dispersed in the matrix material or continuous fibers or fiber bundles oriented within the matrix material. The reinforcement material serves as the load-bearing constituent of the CMC in the event of a matrix crack. In turn, the ceramic matrix protects the reinforcement material, maintains the orientation of its fibers, and serves to dissipate loads to the reinforcement material. Silicon-based CMCs, such as silicon carbide (SiC) as the matrix and/or reinforcement material, have become of particular interest in high-temperature applications due to their high temperature capabilities, such as for use in components of gas turbines, including aircraft gas turbine engines and land-based gas turbine engines. SiC fibers have also been used as a reinforcement material for a variety of other ceramic matrix materials, including TiC, $Si_3N_4$, and $Al_2O_3$.

Continuous fiber reinforced ceramic composites (CFCC) are a particular type of CMC that offers light weight, high strength, and high stiffness for a variety of high temperature load-bearing applications, such as in shrouds, combustor liners, vanes (nozzles), blades (buckets), and other high-temperature components of gas turbines. A notable example of a CFCC material developed by the General Electric Company under the name HiPerComp® contains continuous SiC fibers in a matrix of SiC and elemental silicon or a silicon alloy.

Various techniques may be employed in the fabrication of CMCs, including chemical vapor infiltration (CVI), wet drum winding, lay-up, lamination, pyrolysis, and melt infiltration (MI). These fabrication techniques have been used in combination with tooling or dies to produce near-net-shape articles through processes that include the application of heat and chemical processes at various processing stages. Examples of such processes, particularly for SiC/Si—SiC (fiber/matrix) CFCC materials, are disclosed in U.S. Pat. Nos. 5,015,540, 5,330,854, 5,336,350, 5,628,938, 6,024,898, 6,258,737, 6,403,158, and 6,503,441, and U.S. Patent Application Publication No. 2004/0067316.

One process of manufacturing CMCs entails the use of CMC prepregs, which are typically sheet-like structures including the reinforcement fibers impregnated with a slurry that contains a precursor of the matrix material and one or more organic binders. The prepreg must undergo processing (e.g., firing) to convert the precursor to the desired ceramic matrix material. Prepregs for CFCC materials frequently comprise a two-dimensional fiber array comprising a single layer of aligned tows (bundles of individual filaments) impregnated with a matrix precursor to create a generally two-dimensional lamina. Multiple plies of the resulting prepregs are then stacked and debulked to form a laminate preform, a process referred to as "lay-up." The prepregs are typically, but not necessarily, arranged so that tows of adjacent prepregs are oriented transverse (e.g., perpendicular) to each other, providing greater strength in the laminar plane of the preform (corresponding to the principal (load-bearing) directions of the final CMC article). As an example, FIG. 1 represents a surface region of a CMC article 10 including multiple laminae 12, each the result of individual prepreg tapes or sheets. As also shown in FIG. 1, each lamina 12 contains a ceramic reinforcement made up of unidirectionally-aligned fibers 17 encased in a ceramic matrix 14 formed by conversion of the ceramic matrix precursor (e.g., after firing).

As illustrated in FIG. 2, a process utilized in making prepreg CMC preforms includes a winding technique to form the fibers 20 (individual filaments or tows) into a unidirectional prepreg tape, which is then used for the lay-up of the composite preform. As represented in FIG. 2, some winding techniques involve coating the fibers 20. The fibers 20 are coated for several purposes, such as to protect them during composite processing, to modify fiber-matrix interface strength and to promote or prevent mechanical and/or chemical bonding of the fiber and matrix. A number of different techniques have been developed for applying coatings to ceramic fiber, such as slurry-dipping, sol-gel, sputtering and chemical vapor deposition (CVD). Of these techniques, CVD may be considered as being most successful in producing impervious coatings of uniform thickness and controlled composition. In a typical CVD process, the fibers and reactants are heated to an elevated temperature where coating precursors decompose and deposit as the coating.

Continuous fiber coating processes have been preferred for composites processed by the winding technique. In a continuous coating process, as shown in FIG. 2, the fibers 20 are continuously passed through a CVD reactor 22 containing coating precursors 24 to form the coated fiber 26. As also shown in FIG. 2, a continuous fiber coating process may involve running a single fiber tow or filament through the CVD reactor 22 at a time. The coating may be conducted at low pressure, and the fiber 20 may be transported through the reactor 22 at a slow speed, to insure uniform coating on the coated fiber 26. Such a CVD coating process suffers from a significant number of broken fibers, and "loose" fibers when a fiber tow is coated (i.e., "fuzz"), which degrades throughput or yield of the process. Although such a fiber coating process may provide an effective coated fiber 26, there remains a need for further improvements to CVD coated fibers with higher productivity.

As illustrated in FIG. 2, a winding technique may also form the coated fiber 26 (a filament or tow) into a unidirectional prepreg tape by impregnating the coated fiber 26 with a matrix precursor. For example, a wet drum winding processes for impregnating the coated ceramic fiber 26 may entail pulling the ceramic fiber 26 through a slurry 27 of a matrix precursor slurry mixture that includes suitable matrix precursor materials, organic binders, and solvents, as shown in FIG. 2. The resulting precursor-impregnated fiber 28 is then wound around a drum 29 to form a planar unidirectional prepreg tape. Before contacting the drum 29, the precursor-impregnated fiber 28 is typically pulled through an orifice to control the amount of slurry picked up. By indexing the drum 29 (and/or the slurry 27 and orifice), the precursor-impregnated fiber 28 is laid down at a constant pitch to yield a continuous, planar unidirectional prepreg tape. Prior to being wound with the precursor-impregnated fiber 28, the drum 29 may be wrapped with a release sheet so that the resulting prepreg tape can be more easily removed from the drum 29. While on the drum 29, the prepreg tape may be allowed to air dry by allowing the solvents to evaporate. Alternatively, the tape may be cut from the drum 29, laid flat, and allowed to air dry.

Prepreg tapes produced by such a wet drum winding processes may have a surface roughness, or waviness, corresponding to the pitch of the fiber 28 on the drum 29. There may also be variability in the distribution of fiber and matrix across the tape because of the pitch. Furthermore, because the fiber is under tension during the winding process, the impregnated fiber 28 may tend to be pulled down onto the drum surface, yielding a prepreg tape that has proportionally more fiber at the surface of the tape contacting the drum 29 and proportionally more matrix precursor at the surface of the tape facing away from the drum 29.

Such a wet drum winding process can also suffer from a significant number of broken fibers, and loosely adhering fibers 20 (i.e., "fuzz") when a tow is utilized, that can break off and cause blockage of the orifice. Consequently, drum winding operations may require constant operator supervision so that such blockages can be removed as they occur.

Another complication of a drum winding processes may revolve around necessity to completely impregnate (i.e., wet out) the fiber 20 with the slurry 27 during the winding process, which requires that the fiber 16 spend a sufficient amount of time submersed in the slurry 27. This submersion time, which can be about five seconds for certain processes, may place a limit on the speed with which the fiber 16 can be drawn through the slurry 27 bath. Consequently, the time necessary to drum wind a 100-meter fiber 20 tow can be relatively lengthy.

Thus, improvements to the fiber coating process are set forth in U.S. Pat. No. 10,370,292: entitled "Apparatus and Methods for Processing Ceramic Fibers," filed on Oct. 5, 2017 and assigned to General Electric Company. In particular, the '292 patent describes a ceramic fiber processing apparatus, such as the apparatus 32 shown in FIG. 3. Further, as shown, the apparatus 32 includes a frame 40 having a first portion 42 that extends to a second portion 44. Moreover, as shown, the frame 40 includes a first spacing member 46 and/or a second spacing member 48 that extend between first and second portions 42, 44 to define a void 50. Thus, as shown, unidirectional ceramic fibers 30 extend across the void 50 defined by the frame 40 to form a planar array 34. For example, the unidirectional ceramic fibers 30 may be substantially arranged or positioned along a plane across the void 50. At least one of the ceramic fibers 40 may include a plurality of individual ceramic filaments, such as a tow. The frame 40 may also include an upper frame portion 52 and a lower frame portion 54. Thus, at least one coating may be deposited on the ceramic fibers 30 secured in the frame 40 via a chemical vapor deposition (CVD) process. For example, one or more of the frames 40 may be positioned within a CVD reactor and processed therein to deposit a coating on the ceramic fibers 30.

Accordingly, the art is continuously seeking new and improved systems and methods for coating and/or processing ceramic fibers (to form prepregs) for producing CMCs.

BRIEF DESCRIPTION

Aspects and advantages of the present disclosure will be set forth in part in the following description, or may be obvious from the description, or may be learned through practice of the present disclosure.

In one aspect, the present disclosure is directed to a system for coating ceramic fibers for use in manufacturing ceramic matrix composite (CMC) articles. The system includes a frame having a plurality of frame members arranged so as to create a void therebetween. At least one of the plurality of frame members includes a hollow body and at least one perforated hole defined in the hollow body. The ceramic fibers are securable at respective ends of the frame and extend across the void. The system also includes an inlet in fluid communication with the perforated hole(s) so as to allow a coating material to flow into and through the hollow body and out of the perforated hole(s) at a location of at least a portion of one of the ceramic fibers. As such, the coating material is configured to cause the portion of one of the ceramic fibers to separate from the frame such that the portion is uniformly coated with the coating material.

In another aspect, the present disclosure is directed to a method for coating ceramic fibers for use in manufacturing ceramic matrix composite (CMC) articles. The method includes providing a frame having of a plurality of frame members arranged so as to create a void therebetween. Further, at least one of the plurality of frame members has a hollow body and at least one perforated hole defined in the hollow body. The method further includes securing the ceramic fibers at respective ends of the frame such that the ceramic fibers extend across the void. The method also includes providing an inlet in fluid communication with the perforated hole(s) defined in the hollow body. Moreover, the method includes injecting a coating material into and through the inlet such that the coating material flows through the hollow body and out of the perforated hole(s) at a location of at least a portion of one of the ceramic fibers. The coating material causes the portion of one of the ceramic fibers to separate from the frame such that the portion is uniformly coated with the coating material.

These and other features, aspects and advantages of the present disclosure will become better understood with reference to the following description and appended claims. The accompanying drawings, which are incorporated in and constitute a part of this specification, illustrate embodiments of the disclosure and, together with the description, serve to explain the principles of the present disclosure.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
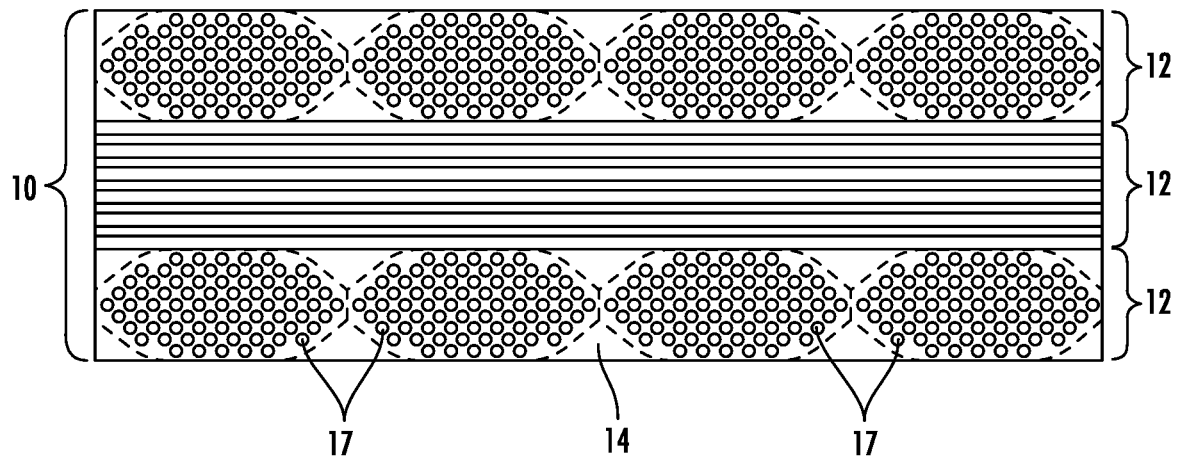
FIG. 1 illustrates a cross-sectional view of a portion of a ceramic matrix composite (CMC) article.
Figure 2:
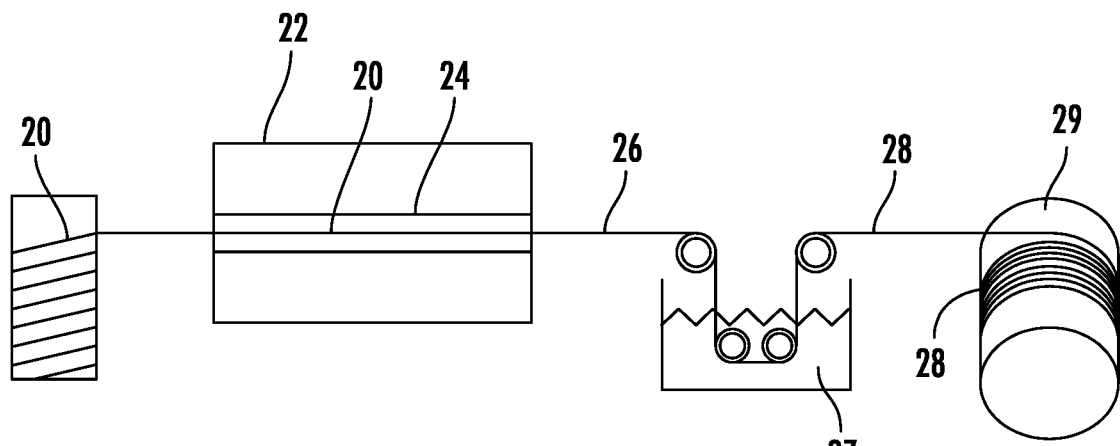
FIG. 2 illustrates a ceramic fiber coating and ceramic fiber impregnating process according to conventional construction.
Figure 3:
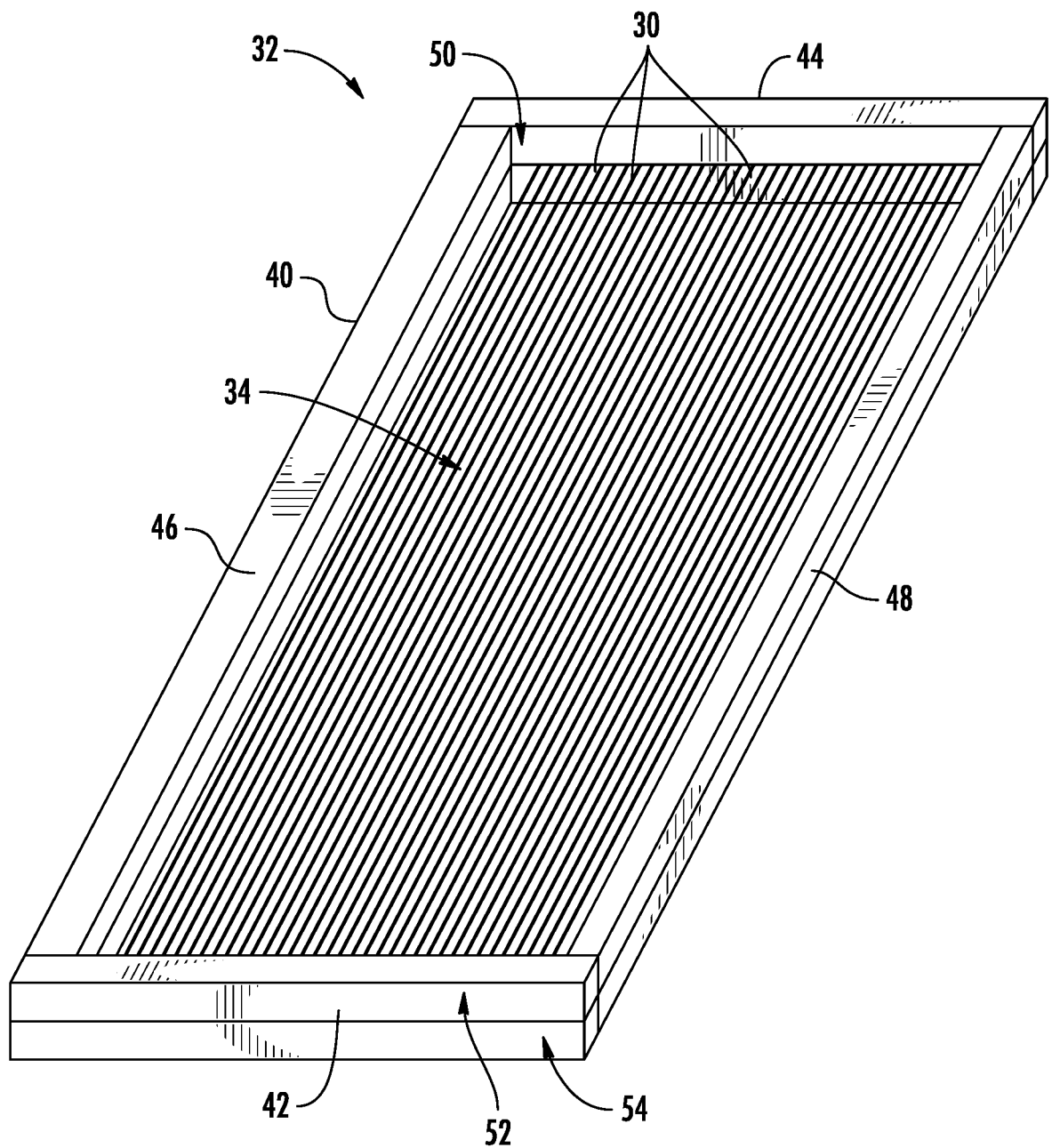
FIG. 3 illustrates a perspective view of a system for coating ceramic fibers according to conventional construction.

Reference now will be made in detail to embodiments of the present disclosure, one or more examples of which are illustrated in the drawings. Each example is provided by way of explanation of the present disclosure, not limitation of the present disclosure. In fact, it will be apparent to those skilled in the art that various modifications and variations can be made in the present disclosure without departing from the scope of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Any examples of parameters are not exclusive of other parameters of the disclosed embodiments. Components, aspects, features, configurations, arrangements, uses and the like described, illustrated, or otherwise disclosed herein with respect to any particular embodiment may similarly be applied to any other embodiment disclosed herein.

Generally, the present disclosure is directed to a system and method for enabling uniform chemical vapor deposition of interfacial coatings on ceramic fiber tows held onto a static support frame. Further, in an embodiment, the frame may include various frame members that have perforated holes formed therein for transferring chemical reagent to the fiber tows, directly at the point of use. As such, the fiber tows can be used in use in manufacturing ceramic matrix composites suitable for high temperature application, especially in gas turbine engines.

Accordingly, the present disclosure includes many advantages not present in the prior art. For example, in certain instances, surface contact points of the fiber tows can inhibit uniform gas flow of the precursor gasses to reach the internal filaments. More specifically, the amount of deposition in the vicinity of the frame, and most particularly on the fibers in direct contact with the frame and the interior fiber filaments, is much lower or nonexistent compared to remaining fibers more distant from the contact points. Accordingly, the holes described in the present disclosure addresses this issue to provide uniform coating to all fiber tows. Moreover, the risk of adhesion of the outer fiber filaments to the support frame is reduced because the fiber filaments have less of a risk of becoming encased in coating. As such, when the fiber filaments are removed from the frame, less coating is lost, thereby maintaining desired mechanical properties of the CMC.

Accordingly, the present disclosure provides for precursor transport of the coating material directed directly into the fiber tows, thereby ensuring uniform coating thickness and distribution. Furthermore, by flowing the gaseous coating material through the hollow frame and the holes therein, the frame is converted into a fluidized bed for the fiber tows, in which there is no contact with the frame. As such, the present disclosure eliminates uncoated contact areas of fiber tows, thereby improving mechanical properties of the material.

Referring now to the drawings, FIGS. 4-10 illustrate various views of multiple embodiments of an exemplary ceramic fiber processing system 100 according to the present disclosure. As will be described herein, the system 100 may facilitate or provide for the processing of ceramic fibers for use in manufacturing ceramic matrix composite (CMC) articles. For example, in an embodiment, the system 100 may facilitate the coating of ceramic fiber via a batch process and/or the formation of a prepreg tape (e.g., infiltration) from coated ceramic fiber via a batch process. Alternatively, a plurality of the systems 100 may be coupled together, or each system 100 may form a portion or a segment of a larger structure, that facilitates the coating of ceramic fiber via a continuous process and/or the formation of a prepreg tape including coated ceramic fiber via a continuous process.

Figure 4:
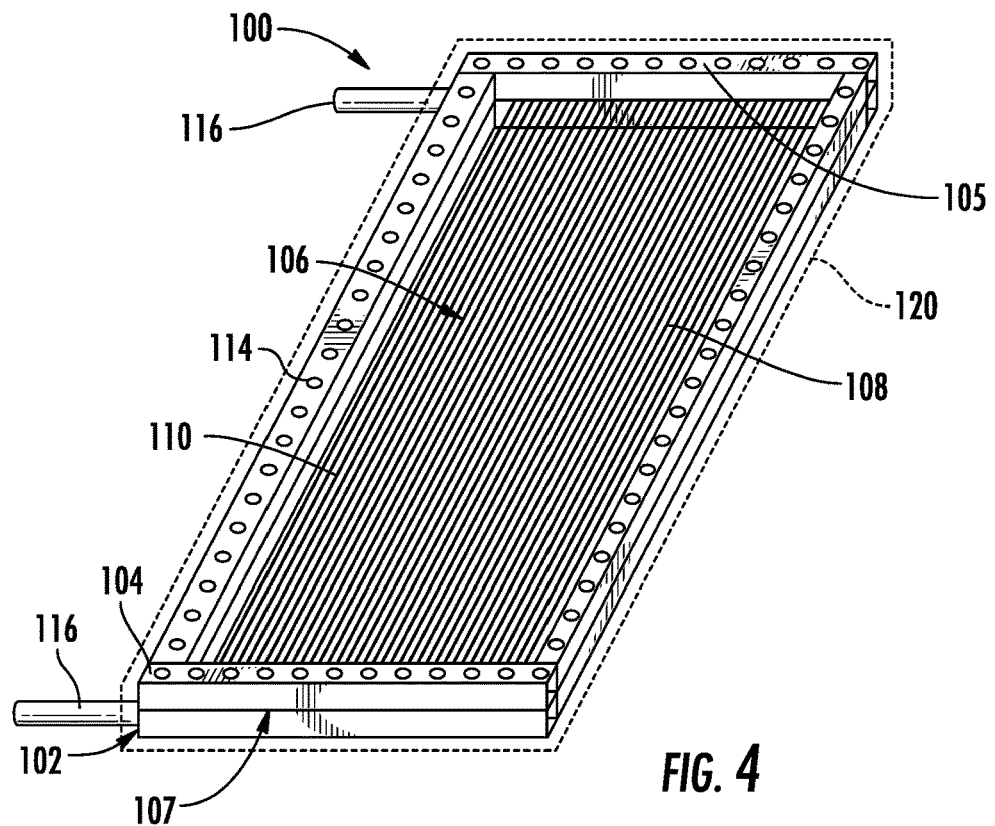
FIG. 4 illustrates a perspective view of one embodiment of a system for coating ceramic fibers according to the present disclosure.
Figure 5:
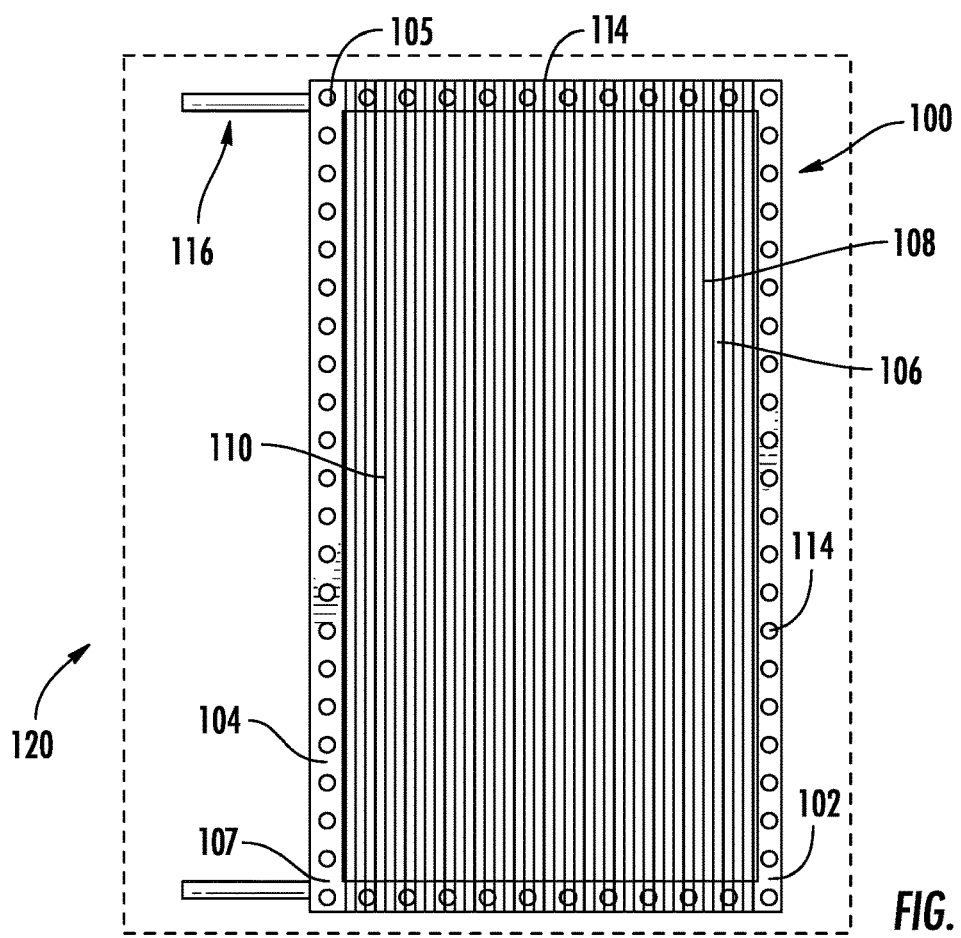
FIG. 5 illustrates a top view of the system of FIG. 4.
Figure 6:
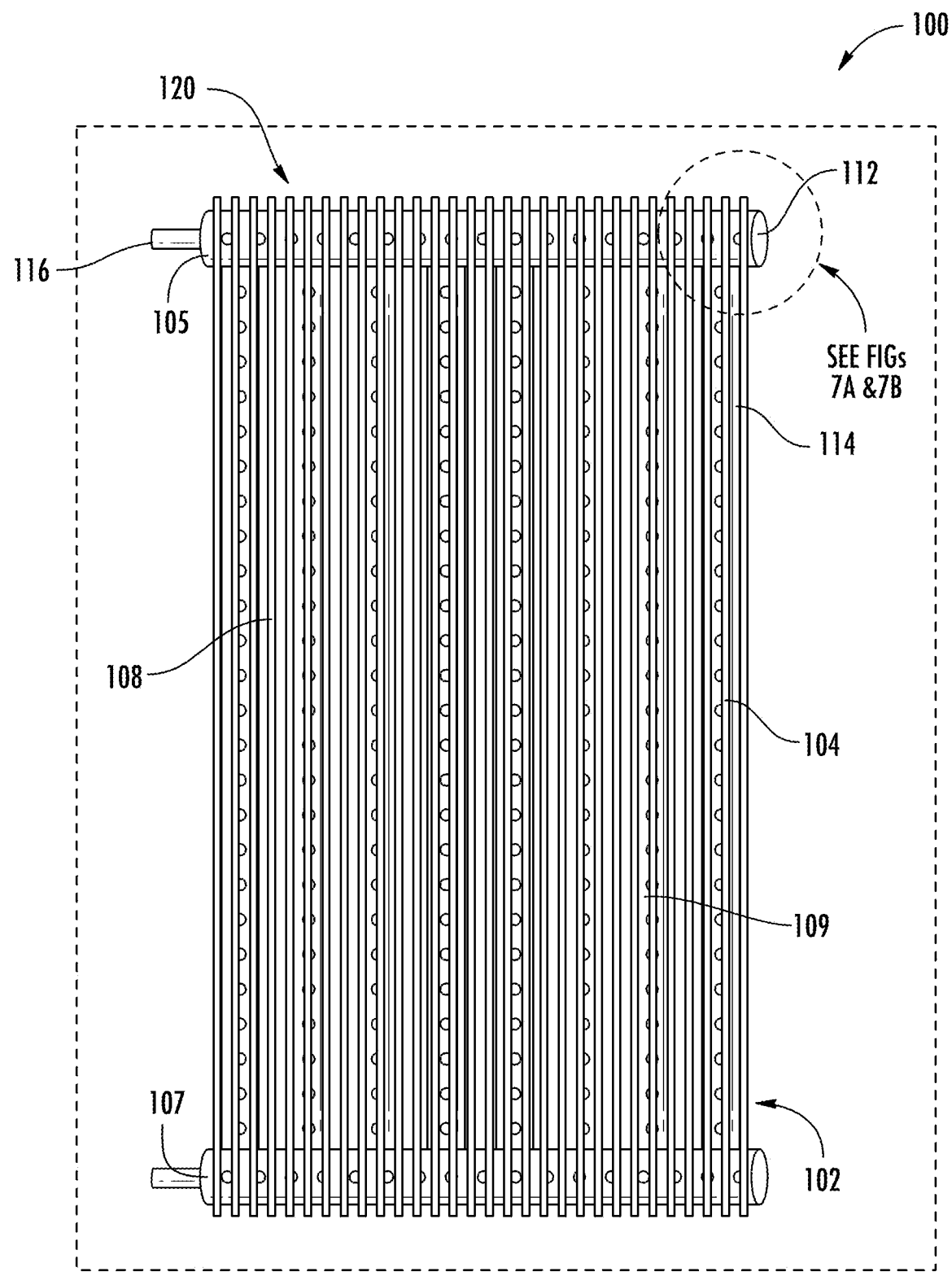
FIG. 6 illustrates a perspective view of another embodiment of a system for coating ceramic fibers according to the present disclosure.

In addition, as shown, the system 100 may include a frame 102 having a plurality of frame members 104 arranged so as to create a void 106 therebetween. For example, in an embodiment, as shown in FIGS. 4-6, the plurality of frame members 104 includes a first frame member 105 at a first end of the frame 102 and a second frame member 107 at an opposing, second end of the frame 102. Furthermore, in another embodiment, as shown particularly in FIG. 6, the frame 102 may include one or more additional frame members 109 extending between the first and second frame members 105, 107. In the illustrated embodiment, for example, the frame 102 includes a plurality of additional frame members 109 extending between the first and second frame members 105, 107. Thus, as shown in FIGS. 4-6, the system 100 also includes a plurality of ceramic fibers 108 that may extend across the void 106, may be positioned within the void 106 (entirely or partially), or may be adjacent to the void 106. In this way, the void 106 may expose the ceramic fibers 108.

In particular embodiments, the ceramic fibers 108 may be individual ceramic filaments or strands, ceramic fiber tows, or a combination of individual filaments and tows. As used herein, a "ceramic fiber tow" or simply a "tow," generally refers to a bundle of a plurality of individual ceramic filaments or loose strands. Further, in certain embodiments, the filaments of a tow may be randomly intermingled or arranged in a pattern, and/or may be continuous or non-continuous. For example, a tow may include broken filaments or filament segments. As another example, the filaments of a tow may be substantially parallel, twisted or otherwise arranged. Furthermore, in an embodiment, a tow may act substantially in the same manner as a single or individual filament. It will also be appreciated that an "individual ceramic filament," or simply an "individual filament," as used herein, refers to a singular or non-bundled elongate ceramic member.

Referring particularly to FIGS. 4-6, the ceramic fibers 108 may be secured at respective ends of the frame 102 and may extend across the void 106 in a unidirectional fashion (e.g., for the formation of a unidirectional CMC prepreg tape and/or a unidirectional CMC article, as is known in the art). Further, as shown, the ceramic fibers 108 may be secured to the frame 102 in any suitable manner to facilitate processing. For example, in an embodiment, the ceramic fibers 108 may be wrapped, wound, tied, or clamped at respective ends of the frame 102.

Further, in an embodiment, the ceramic fibers 108 may include relatively minor directional variations as they extend across the void 106, but the ceramic fibers 108 may be unidirectional such that they extend substantially in the first direction and do not cross-over each other. Similarly, the ceramic fibers 108 may include minor directional variations, but the ceramic fibers 108 may be unidirectional such that they extend substantially along the first direction and/or substantially parallel to one another, as a whole. In an exemplary embodiment, the ceramic fibers 108 may be ceramic fiber tows or non-bundled ceramic fiber filaments. If the ceramic fibers 108 include at least one tow, the at least one tow, as a whole, may be unidirectional (extend along the first direction) and/or the ceramic filaments making up the tow may be unidirectional. In some other embodiments, the ceramic filaments of a tow of the ceramic fibers 108 may extend in differing directions than the first direction (i.e., are non-unidirectional, such as twisted or woven filaments), but the tow, as a whole, may extend substantially in the first direction such that the ceramic fibers 108 across the void 106 are unidirectional.

Moreover, in an embodiment, the frame 102 may be of any design, configuration or mechanism that forms a space or void 106 and supports a planar array 110 of unidirectional ceramic fibers 108 across the void 106. Further, in an embodiment, the void 106 may be of any size or shape for any corresponding size or shape planar array 110. In addition, in an embodiment, the void 106 may be an unobstructed area in which the planar array 110 is provided. In some embodiments, the frame 102 may be configured such that the area about the void 106 (and thereby also about the planar array 110 of unidirectional ceramic fibers 108 positioned therein) is open or unobstructed. For example, the frame 102 may be configured such that the area above and/or below the planar array 110 of unidirectional ceramic fibers 108 is unobstructed to allow for unhindered coating of the ceramic fibers 108.

Referring particularly to FIG. 6, at least one of the plurality of frame members 104 may include a hollow body 112 and at least one perforated hole 114 defined in the hollow body 112. In another exemplary embodiment, each of the frame members 104 of the frame 102 may have a hollow body 112. Further, in another embodiment, one or more of the hollow bodies 112 may include a plurality of perforated holes 114. In such embodiments, as shown generally in FIGS. 4-6, the perforated holes 114 may be arranged on one planar side of the hollow body 112. In alternative embodiments, the perforated holes 114 may be arranged in a variation of patterns around the hollow body 112. For example, the perforated holes 114 may be arranged to extend around a circumference of the frame member 104, or may be arranged in rows or columns on the frame member 104. Further, in an embodiment, the perforated holes 114 may be arranged in any suitable pattern to allow for processing of the ceramic fibers 108.

Referring particularly to FIGS. 4-6, the system 100 may also include an inlet 116 positioned on at least one of the frame members 104 and in fluid communication with the perforated hole(s) 114 so as to allow a coating material 118 (FIGS. 7A-7B) to flow into and through the hollow body 112 and out of the perforated hole(s) 114 at a location of at least a portion of one of the ceramic fibers 108. In an exemplary embodiment, as shown in FIGS. 4-6, the plurality of frame members 104 and ceramic fibers 108 may be coated in a coating chamber 120 that includes at least the ceramic fibers 108, the inlet 116, and the frame members 104. In certain figures, the coating chamber 120 may be omitted for simplicity and to further illustrate the internal components of the system 100. In further embodiments, a plurality of gas inlets 116 may be positioned on a plurality of frame members 104 to facilitate fluid communication with a plurality of perforated hole(s) 114 in the hollow bodies 112 of the frame members 104.

Figure 7A:
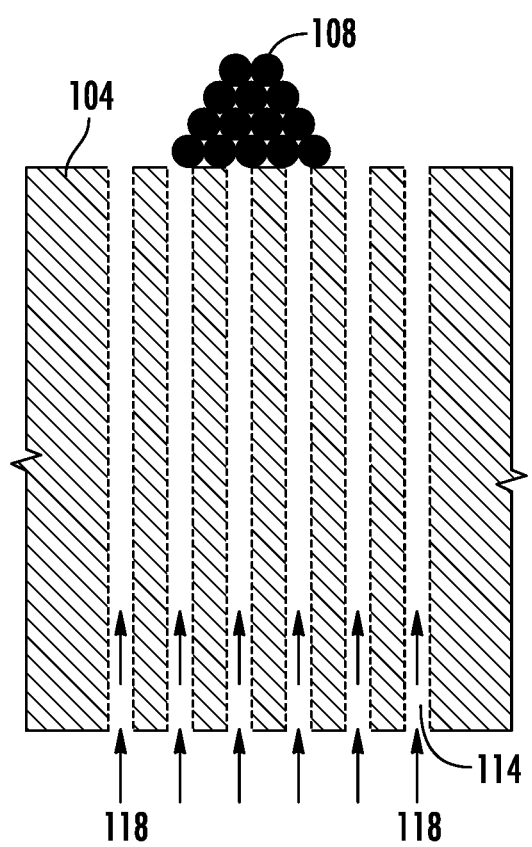
FIG. 7A illustrates a schematic diagram of one embodiment of a system according to the present disclosure, particularly illustrating ceramic fibers secured to a frame thereof before a coating process.
Figure 7B:
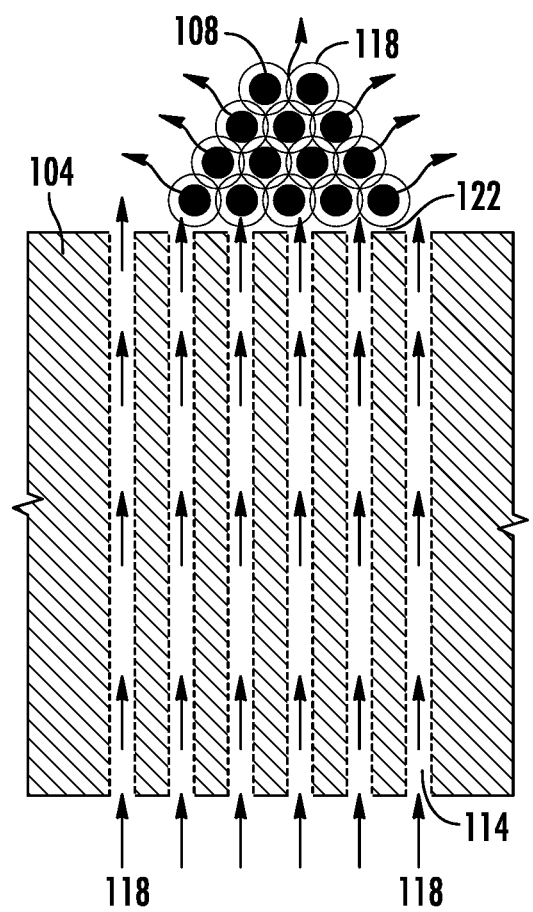
FIG. 7B illustrates a schematic diagram of one embodiment of a system according to the present disclosure, particularly illustrating ceramic fibers secured to a frame thereof after a coating process.
Figure 8:
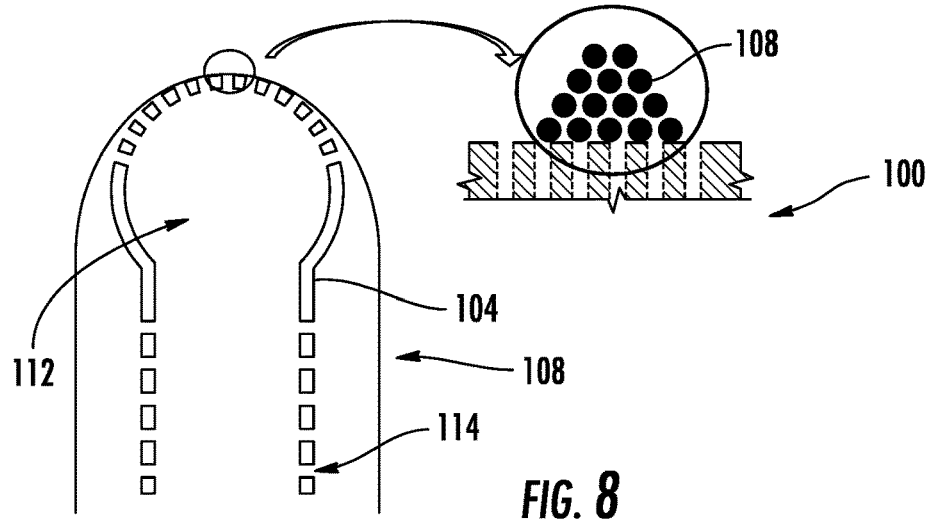
FIG. 8 illustrates a schematic diagram of one embodiment of a system according to the present disclosure, particularly illustrating the ceramic fibers before a coating process.
Figure 9:
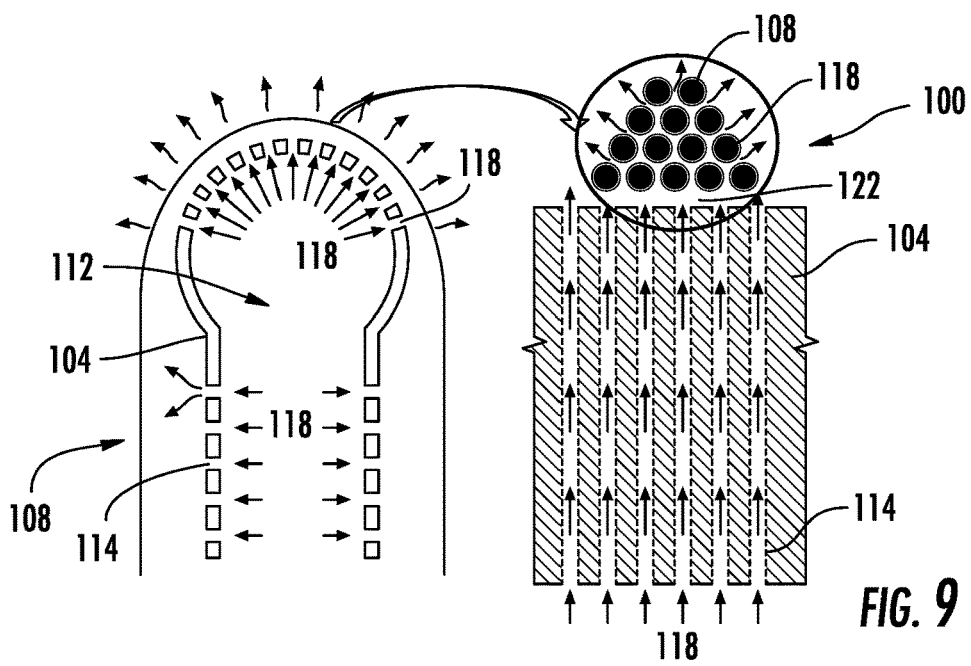
FIG. 9 illustrates a schematic diagram of the system of FIG. 8, particularly illustrating the ceramic fibers during the coating process.
Figure 10:
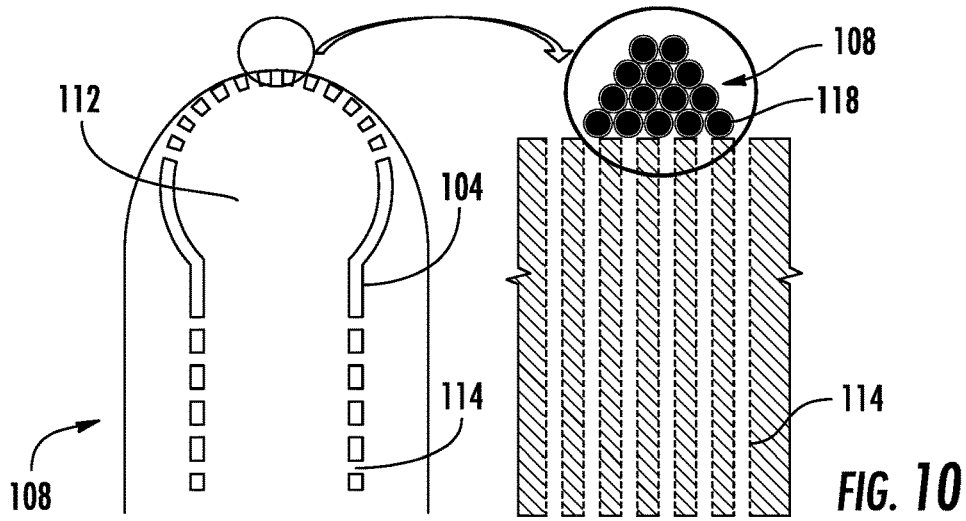
FIG. 10 illustrates a schematic diagram of the system of FIG. 8, particularly illustrating the ceramic fibers after the coating process.

In particular embodiments, the coating material 118 may include a gaseous carrier and a chemical reagent. Thus, in such embodiments, the gaseous carrier is configured to cause at least a portion or the entirety of one of the ceramic fibers 108 to separate from the frame 102, creating a space 122 as shown in FIGS. 7B and 9, such that the portion (or the entirety) of the ceramic fiber 108 is uniformly coated with the coating material 118. More particularly, as shown in FIGS. 7A-9, cross-sectional views of one embodiment of one of the frame members 104 of the system 100 with the ceramic fibers 108 resting thereon before (FIGS. 7 and 8) and during (FIGS. 7 and 9) the coating process are illustrated. For example, as shown in FIGS. 7 and 9, one of the frame members 104 having a plurality of perforated holes 114 formed therein is illustrated with the coating material 118 (represented by the arrows) floating therethrough. Furthermore, as shown in FIGS. 7-9, a portion of one of the ceramic fibers 108 is separated from the frame member 104 via the flow of the coating material 118 (e.g., due to the forces exerted by the gaseous carrier) so as to provide a more even coating thereto. Furthermore, as shown in FIG. 10, after the coating process is complete, the ceramic fibers 108 return to a resting position against the frame member 104.

It should be understood that any coating material 118 suitable for processing ceramic fibers used in manufacturing CMC prepregs and/or articles may be used to coat the ceramic fibers 108. For example, the coating material 118 may be a surface modification to the ceramic fibers 108 that affects the fiber-matrix interface of a resulting CMC article made from the ceramic fibers 108. This can be accomplished by a coating material 118 of suitable ceramic material that inhibits the ceramic fibers 108 from reacting or bonding with the matrix of the CMC article. The ceramic coating material 118 may allow the ceramic fibers 108 to pull out from the matrix and/or slide along the matrix, thus increasing the fracture toughness of the resulting CMC article. However, a coating material 118 that provides an additional and/or differing function(s) and/or other coating types (e.g., non-ceramic) may be utilized. In certain embodiments, for example, the coating material 118 may be at least one of boron nitride, carbon, silicon carbide, silicon nitride or a combination thereof. In another exemplary embodiment, the boron nitride may be silicon-doped. Furthermore, in particular embodiments, the ceramic fibers 108 may be SiC fibers or C fibers.

Figure 11:
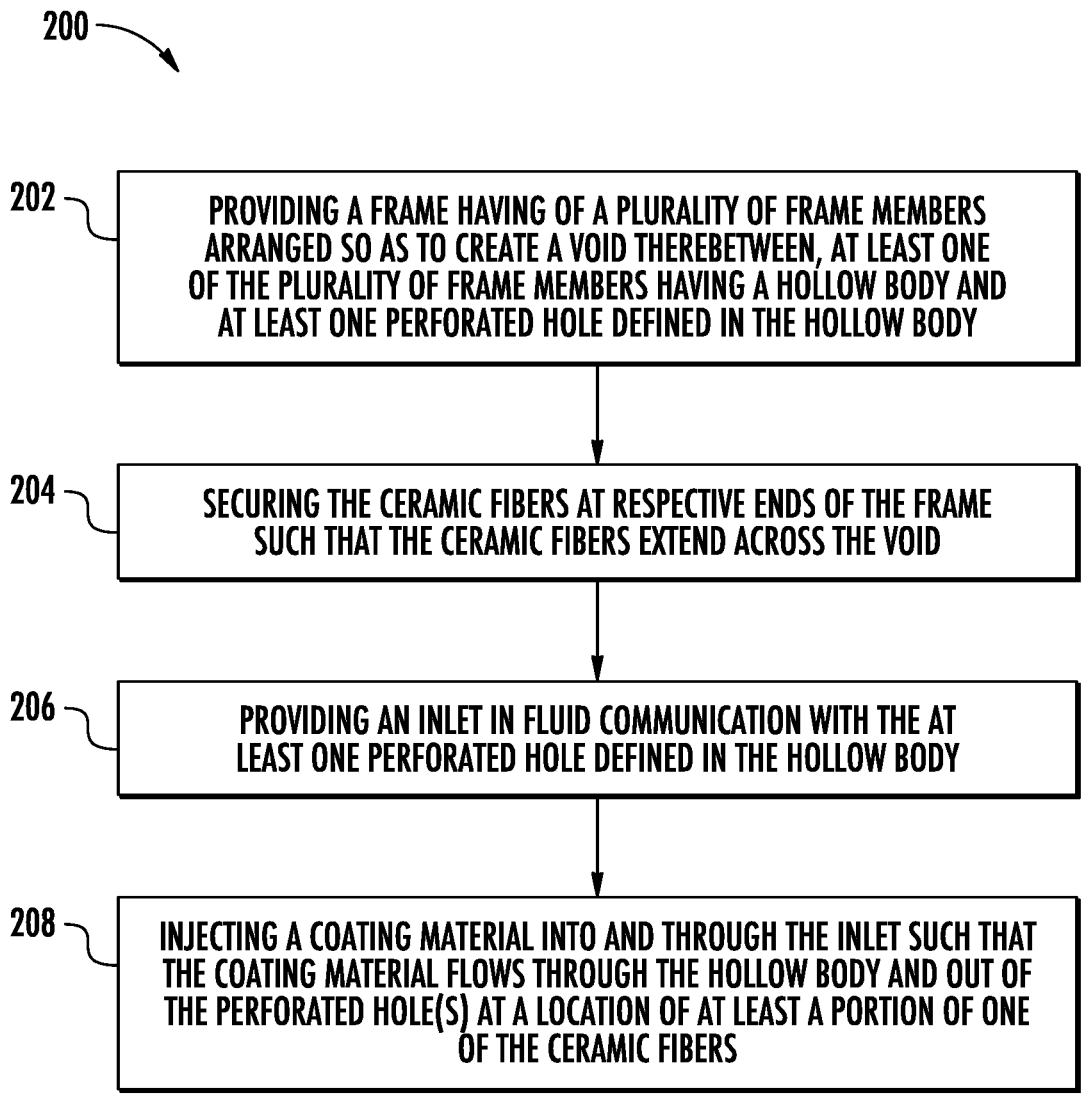
FIG. 11 illustrates is a flow diagram of one embodiment illustrating a method for coating ceramic fibers for use in manufacturing CMC articles according to the present disclosure.

Referring now to FIG. 11, a flow diagram of one embodiment of a method 200 for coating ceramic fibers for use in manufacturing ceramic matrix composite (CMC) articles is illustrated in accordance with aspects of the present disclosure. In particular embodiments, for example, the method 200 can be used to coat the ceramic fibers 108 described herein. The method 200 is described herein as implemented using, for example, the system 100 illustrated in FIGS. 4-10.

However, it should be appreciated that the disclosed method 200 may be implemented using any other suitable system now known or later developed in the art. In addition, although FIG. 11 depicts steps performed in a particular order for purposes of illustration and discussion, the methods described herein are not limited to any order or arrangement. One skilled in the art, using the disclosures provided herein, will appreciate that various steps of the methods can be omitted, rearranged, combined and/or adapted in various ways.

As shown at (202), the method 200 includes providing a frame having of a plurality of frame members arranged so as to create a void therebetween. Further, as mentioned, at least one of the plurality of frame members has a hollow body and at least one perforated hole defined in the hollow body. As shown at (204), the method 200 includes securing the ceramic fibers at respective ends of the frame such that the ceramic fibers extend across the void. As shown at (206), the method 200 includes providing an inlet in fluid communication with the perforated hole(s) defined in the hollow body. As shown at (208), the method 200 includes injecting a coating material into and through the inlet such that the coating material flows through the hollow body and out of the perforated hole(s) at a location of at least a portion of one of the ceramic fibers. As such, the method 200 may include placing the system 100 in a coating chamber and releasing a coating material 118 through the hollow bodies 112 of the plurality of frame members 104, thereby facilitating the separation of the ceramic fibers 108 from the frame members 104 and allowing for even distribution of the coating material 118 on the ceramic fibers 108.

In an exemplary embodiment, the method 200 may include depositing more than one coating material on the ceramic fibers 108. For example, more than one type of coating material may be applied to the ceramic fibers 108 to provide for specific and distinct characteristics in the resulting CMC article.

Various aspects and embodiments of the present disclosure are defined by the following numbered clauses:

Clause 1. A system for coating ceramic fibers for use in manufacturing a ceramic matric composite (CMC) article, the system comprising: a frame comprising a plurality of frame members arranged so as to create a void therebetween, at least one of the plurality of frame members comprising a hollow body and at least one perforated hole defined in the hollow body, wherein the ceramic fibers are securable at respective ends of the frame so as to extend across the void; and an inlet in fluid communication with the at least one perforated hole so as to allow a coating material to flow into and through the hollow body and out of the at least one perforated hole at a location of at least a portion of one of the ceramic fibers,
wherein the coating material is configured to cause the portion of one of the ceramic fibers to separate from the frame such that the portion is uniformly coated with the coating material.

Clause 2. The system of any of the preceding clauses, wherein the ceramic fibers comprise at least one of ceramic fiber tows or non-bundled ceramic fiber filaments.

Clause 3. The system of any of the preceding clauses, wherein the each of the plurality of frame members comprises a hollow body.

Clause 4. The system of any of the preceding clauses, wherein each of the hollow bodies comprises a plurality of perforated holes.

Clause 5. The system of any of the preceding clauses, wherein the plurality of perforated holes of at least one of the plurality of frame members either extends around a circumference of the frame member or is arranged in rows or columns on the frame member.

Clause 6. The system of any of the preceding clauses, wherein the plurality of frame members further comprise, at least, a first frame member, a second frame member, and at least one additional frame member extending across the void between the first and second frame members.

Clause 7. The system of any of the preceding clauses, wherein the coating material comprises a gaseous carrier and a chemical reagent.

Clause 8. The system of any of the preceding clauses, wherein the coating material comprises at least one of boron nitride, carbon, silicon carbide, silicon nitride or a combination thereof.

Clause 9. The system of any of the preceding clauses, wherein the boron nitride is silicon-doped.

Clause 10. The system of any of the preceding clauses, wherein the plurality of frame members and ceramic fibers are coated in a coating chamber.

Clause 11. A method for coating ceramic fibers for use in manufacturing a ceramic matric composite (CMC) article, the method comprising: providing a frame having of a plurality of frame members arranged so as to create a void therebetween, at least one of the plurality of frame members having a hollow body and at least one perforated hole defined in the hollow body; securing the ceramic fibers at respective ends of the frame such that the ceramic fibers extend across the void; providing an inlet in the frame, the inlet being in fluid communication with the at least one perforated hole defined in the hollow body; and injecting a coating material into and through the inlet such that the coating material flows through the hollow body and out of the at least one perforated hole at a location of at least a portion of one of the ceramic fibers, wherein the coating material causes the portion of one of the ceramic fibers to separate from the frame such that the portion is uniformly coated with the coating material.

Clause 12. The method of any of the preceding clauses, wherein the ceramic fibers comprise at least one of ceramic fiber tows or non-bundled ceramic fiber filaments.

Clause 13. The method of any of the preceding clauses, wherein each of the plurality of frame members comprise a hollow body.

Clause 14. The method of any of the preceding clauses, wherein each of the hollow bodies comprises a plurality of perforated holes.

Clause 15. The method of any of the preceding clauses, wherein the plurality of perforated holes of at least one of the plurality of frame members either extends around a circumference of the frame member or is arranged in rows or columns on the frame member.

Clause 16. The method of any of the preceding clauses, wherein the plurality of frame members further comprise, at least, a first frame member, a second frame member, and at least one additional frame member extending across the void between the first and second frame members.

Clause 17. The method of any of the preceding clauses, wherein the coating material comprises a gaseous carrier and a chemical reagent.

Clause 18. The method of any of the preceding clauses, wherein the coating material comprises at least one of boron nitride, carbon, silicon carbide, silicon nitride or a combination thereof.

Clause 19. The method of any of the preceding clauses, wherein the boron nitride is silicon-doped.

Clause 20. The method of any of the preceding clauses, wherein the plurality of frame members and ceramic fibers are coated in a coating chamber.

This written description uses examples to disclose the present disclosure, including the best mode, and also to enable any person skilled in the art to practice the present disclosure, including making and using any devices or systems and performing any incorporated methods. The patentable scope of the present disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A system for coating ceramic fibers for use in manufacturing a ceramic matrix composite (CMC) article, the system comprising:
    a frame comprising a plurality of frame members including a first frame member at a first end of the frame and a second frame member at an opposing second end of the frame, the first frame member and the second frame member defining a void therebetween, wherein the frame includes one or more additional frame members extending across the void between the first and second frame members, at least one of the plurality of frame members comprising a hollow body and at least one perforated hole defined in the hollow body, wherein the ceramic fibers are securable at the first and second ends of the frame so as to extend across the void;
    a coating material; and
    an inlet in fluid communication with the at least one perforated hole of the hollow body so as to allow a coating material to flow into and through the hollow body and out of the at least one perforated hole at a location of at least a portion of one of the ceramic fibers,
    wherein the at least one perforated hole is configured to cause the portion of one of the ceramic fibers to separate from the frame such that the portion is uniformly coated with the coating material.

2. The system of claim 1, wherein the each of the plurality of frame members comprises a hollow body.

3. The system of claim 2, wherein each of the hollow bodies comprises a plurality of perforated holes.

4. The system of claim 3, wherein the plurality of perforated holes of at least one of the plurality of frame members either extends around a circumference of the frame member or is arranged in rows or columns on the frame member.

5. The system of claim 3, wherein the plurality of frame members further comprise, at least, a first frame member, a second frame member, and at least one additional frame member extending across the void between the first and second frame members.

6. The system of claim 1, wherein the coating material comprises a gaseous carrier and a chemical reagent.

7. The system of claim 6, wherein the coating material comprises at least one of boron nitride, carbon, silicon carbide, silicon nitride or a combination thereof.

8. The system of claim 7, wherein the boron nitride is silicon-doped.

9. The system of claim 7, wherein the plurality of frame members and ceramic fibers are coated in a coating chamber.

* * * * *